(12) United States Patent
Bright et al.

(10) Patent No.: US 7,255,290 B2
(45) Date of Patent: Aug. 14, 2007

(54) VERY HIGH SPEED RATE SHAPING FUEL INJECTOR

(75) Inventors: Charles B. Bright, 2110 Polk Dr., Ames, IA (US) 50010; Jon C. Garza, Puyallup, WA (US)

(73) Assignee: Charles B. Bright, Ames, IA (US)

( * ) Notice: Subject to any disclaimer, the term of this patent is extended or adjusted under 35 U.S.C. 154(b) by 95 days.

(21) Appl. No.: 11/136,349

(22) Filed: May 24, 2005

(65) Prior Publication Data

US 2005/0274820 A1    Dec. 15, 2005

Related U.S. Application Data

(60) Provisional application No. 60/579,483, filed on Jun. 14, 2004.

(51) Int. Cl.
*B05B 1/08* (2006.01)

(52) U.S. Cl. ............ 239/102.2; 239/102.1; 239/585.1; 239/900; 310/26; 310/30; 310/34; 251/129.21

(58) Field of Classification Search ......... 239/102.2, 239/102.1, 585.1, 533.2, 900; 251/129.21; 335/215, 220, 263; 123/467, 498; 310/26, 310/30, 34
See application file for complete search history.

(56) References Cited

U.S. PATENT DOCUMENTS

| | | | |
|---|---|---|---|
| 2,930,912 A | 3/1960 | Miller | |
| 4,308,474 A | 12/1981 | Savage et al. | |
| 4,378,258 A | 3/1983 | Clark et al. | |
| 4,438,509 A | 3/1984 | Butler et al. | |
| 4,914,412 A | 4/1990 | Engdahl et al. | |
| 5,031,941 A | 7/1991 | Schaefer | |
| 5,280,773 A * | 1/1994 | Henkel | 123/467 |
| 5,510,660 A | 4/1996 | Flatau et al. | |
| 5,779,149 A | 7/1998 | Hayes, Jr. | |
| 5,810,255 A * | 9/1998 | Itoh et al. | 239/102.2 |
| 5,819,710 A | 10/1998 | Huber | |
| 5,845,852 A | 12/1998 | Waldman et al. | |
| 6,079,636 A * | 6/2000 | Rembold et al. | 239/88 |
| 6,170,766 B1 * | 1/2001 | Focke et al. | 239/585.1 |

(Continued)

OTHER PUBLICATIONS

Engdahl, Goran; *Handbook of Giant Magnetostrictive Materials*, Academic Press; 2000.

(Continued)

*Primary Examiner*—Dinh Q. Nguyen

(57) ABSTRACT

A very high speed injector permits injecting high pressure diesel oil directly into a diesel engine combustion chamber. The very high speed permits almost arbitrary rate shaping, minimizing formation of diesel particulate matter and oxides of nitrogen pollutants. An electrical waveform is pre-determined for a desired fuel injection rate shape. The electrical waveform is converted into a corresponding magnetic field waveform by a solenoid coil. A giant magnetostrictive material (GMM) transduces the magnetic field waveform into a corresponding mechanical waveform. The mechanical waveform positions a valve element to control flow rate. The very high speed features include a thin solenoid coil of relatively few turns, proportionally supplying up to one hundred amperes at up to one hundred volts in no greater than ten microseconds, the GMM is subject to a bias compressive stress magnitude of no less than fourteen megapascals, and the magnetic flux path is minimized and designed to suppress eddy currents.

18 Claims, 7 Drawing Sheets

U.S. PATENT DOCUMENTS

| | | |
|---|---|---|
| 6,273,966 B1 | 8/2001 | Snodgrass et al. |
| 6,279,842 B1 | 8/2001 | Spain |
| 6,298,829 B1 | 10/2001 | Welch et al. |
| 6,299,703 B1 | 10/2001 | Chen et al. |
| 6,300,855 B1 | 10/2001 | Clark et al. |
| 6,363,913 B1 | 4/2002 | Milam et al. |
| 6,364,221 B1 | 4/2002 | Czimmek |
| 6,570,474 B2 | 5/2003 | Czimmek |
| 6,758,408 B2 | 7/2004 | Czimmek |

OTHER PUBLICATIONS

Moffett, Mark, et al; "Biased Lead Zirconate-Titanate as a High-Power Transducer Material;" NUWC-NPT Reprint Report 10, 766; Naval Warfare Center Division; May 15, 1997.

Pan, Ming-Jen, etal; "Design factors in multilayer actuators;" Mechanical Engineering; Apr. 1996.

Lin, Ching-Yu et al; "Compression Depolarization of PZT Piezoelectric Materials under High Electromechanical Driving Levels;" SPIE Proceedings; v3992 p. 114.

Schuh, C., et al; "Piezoceramic multilayer actuators for fuel injection systems in automotive area;" SPIE Proceedings; v3992 p. 165.

Lupascu, Doru C., et al; "Role of crack formation in the electric fatigue behavior of ferroelectric PZT ceramics"; SPIE Proceedings; v3992 p. 209.

MIL-STD-1376 Piezoelectric Ceramic Material and Measurements Guidelines for Sonar Transducers.

M. A. Ganser, Common Rail Injector with Injection Rate Control, Paper No. 981927, Society of Automotive Engineers—Aug. 13, 1998.

J. Hiousek; "Electronically Controlled Fuel Injection Systems for Medium Speed Diesel Engines"; Paper No. 981928, Society of Automotive Engineers -Aug. 11-13, 1998.

K. Gerbert, et al; "An Evaluatin of Common Rail, Hydraulically Intensified Diesel Fuel Injection System Concepts and Rate Shapes"; Paper No. 981930, Society of Automotive Engineers, Aug. 11-13, 1998.

\* cited by examiner

VERY HIGH SPEED RATE SHAPING FUEL INJECTOR

CROSS REFERENCE TO RELATED APPLICATION

This application is a continuation of Provisional Application Ser. No. 60/579,483 filed Jun. 14, 2004.

BACKGROUND OF THE INVENTION

It is well established that "electronic" fuel injectors use a solenoid to control a hydraulic valve. In a solenoid, a magnetic field traverses the non-ferromagnetic free space between the ferromagnetic pole surfaces. The pole surfaces are then attracted to each other by the mechanical force generated at these surfaces.

Two natural characteristics make a solenoid difficult to use for arbitrary speed rate shaping. First, it is not a proportional displacement device. Stability forces it to be either fully at one end or the other of its travel or moving toward one of these ends. Any shaping is more a result of inherent solenoid behavior rather than what would be desirable to control fuel combustion with air. Second, its mechanical force arises from the discontinuity in permeability at its pole surfaces, which limits its force capability, and this force is an inverse function of the square of the distance between the poles. Thus, the solenoid is inherently an unstable, nonlinear device anywhere between its two ends of travel. The resulting slow "bang-bang" operation increases injector complexity needed to rate shape injected fuel.

Limited force results in limited valve speed capability. U.S. Pat. No. 6,298,829 teaches that the fastest solenoid-operated valve opens in no less than seven hundred microseconds though this time may have been reduced. The need for varying the volumetric fuel flow rate during injection has been defined by SAE papers 981927, 981928, and 981930. Rate shaping for minimum production of diesel particulate matter (DPM) and oxides of nitrogen and maximum fuel economy requires much quicker and more controllable response, which in turn requires much higher and proportionally controllable mechanical force.

When considering practical ways to quickly and compactly generate high and proportionally controllable force, control of electromagnetic phenomena is first choice. In this category, there are only two classes of transducing materials around which to construct a transducer. Both material classes have much higher specific energy than can be obtained using electrostatic or electrodynamic (solenoid) means, enabling fast, compact, and relatively powerful transducers to be constructed. These solid transducing materials strain when subjected to either an electric field or a magnetic field.

The materials that respond to electric fields are known as electrostrictive, ferroelectric, and piezoelectric but will herein be referred to only as piezoelectric material or simply piezos. Similarly, the materials that respond to magnetic fields are known as magnetostrictive, ferromagnetic, and piezomagnetic but will herein be referred to only as magnetostrictive material. As a single class, these materials are referred to herein as shape change materials or SCMs. Colloquially, SCMs are also known as smart materials. There are many other types of SCMs but they are not addressed herein as they are not candidates to drive arbitrary speed fuel injectors. In particular, shape memory alloys lack speed and ferromagnetic shape memory alloys lack force.

The main features of interest combined by the magnetostrictive and piezo SCMs are their specific energy and speed. Since their $19^{th}$ century discovery, a large body of specialized knowledge of their characteristics and optimum use has been developed. In contrast to surface forces such as those generated by a solenoid, SCMs produce powerful internal body forces which allow the energy coupled per unit volume to be much higher than presently possible per unit surface area of that volume. Because of this, one of their best developed high power electrical to mechanical conversion uses has been in Navy sonar sources.

Due to the high forces that SCMs exhibit, the first law of thermodynamics limits strain. The strains that can be obtained are similar in magnitude to thermal strains, but SCMs are useful because these forceful strains can be obtained much more quickly.

Properties Comparison

U.S. Navy data from Moffett et al were used to help construct Table 1, which compares the properties of the piezoelectric and magnetostrictive materials with the most potential as fuel injector drivers. The table follows the convention of compressive force, stress, and strain being denoted by a mathematical negative sign. The 33 subscript denotes that cause and effect are both coaxial.

The table indicates that the electromechanical coupling of a common piezoelectric material is slightly less than that of a recently developed giant magnetostrictive material (GMM). See U.S. Pat. Nos. 4,308,474 and 4,378,258. The Moffett report states that the GMM has a stress-limit advantage due to its lower Young's modulus and would thus provide more output. In this table, it appears as though the compressive bias stress has been limited to what the piezo can tolerate for a reasonable life. Refer to the discussion on piezo "aging" below.

Defining characteristics of these two classes of SCM are compared and contrasted as follows.

By a process known as "poling," piezoelectric action is obtained by artificially distorting the inherent symmetric unit cell crystal structure to be asymmetric. The second law of thermodynamics can be stated as any system in an unstable state tends toward a stable state. The stable state for piezos is the symmetric unit cell state, which is non-piezoelectric. Piezos degrade with time back to the symmetric unit cell state. Performance degradation is accelerated by any combination of over stress, over strain, over voltage, or over temperature, all of which could easily be present in a fuel injector application. This means that piezo operational life is characteristically limited, a possible problem for an engine fuel injector due to the number of cycles that it must operate in a sometimes harsh environment. The US Navy has codified the allowable limits on the characteristic degradation of piezos in MIL-STD-1376.

In contrast, the inherent physics of GMM prevent aging. GMM is made of terbium, dysprosium, and iron formed into an intermetallic alloy by directional crystalline solidification. GMM elements are typically lengthwise grain-oriented rods of the lanthanide series of materials of which $Tb_{0.3}Dy_{0.7}Fe_{1.90-1.95}$ ("terfenol-d") is preferred. According to Engdahl, its magnetostriction originates in a non-bonding inner electron cloud of the terbium atom. Quantum mechanics dictates that this cloud be oblate, making the resulting magnetostriction an inherent property that cannot be permanently destroyed. Above a certain point, the magnetostriction of GMM declines with respect to temperature until it reaches zero at its Curie temperature of 357 degrees celsius. However, heat does not destroy the magnetostriction of the GMM, provided it was not melted.

Cooling it restores full performance.

TABLE 1

Comparison of Transducer Material Properties

| Quantity | SI Units | Calculation Formula | Piezo | GMM |
|---|---|---|---|---|
| Young's modulus at constant magnetic field ($Y^H$) | $N/m^2$ | — | — | $29.0 \times 10^9$ |
| Young's modulus at constant electric field ($Y^E$) | $N/m^2$ | — | $74.1 \times 10^9$ | — |
| Magnetic permeability at constant stress ($\mu^T$) | V-s/A-m | — | — | $5.404 \times 10^{-6}$ |
| Electric permittivity at constant stress ($\epsilon^T$) | A-s/V-m | — | $8.854 \times 10^9$ | — |
| Strain coefficient at constant stress ($d_{33}^T$) | m/A | — | — | $9.10 \times 10^{-9}$ |
| Strain coefficient at constant stress ($d_{33}^T$) | m/V | — | $0.225 \times 10^9$ | — |
| Energy Coupling ($k^2$) | — | $(d_{33}^T)^2 Y^H/\mu^T$ | — | 0.444 |
| Energy Coupling ($k^2$) | — | $(d_{33}^T)^2 Y^E/\epsilon^T$ | 0.424 | — |
| Stress Bias | $N/m^2$ | — | $^-41 \times 10^6$ | $^-41 \times 10^6$ |
| Alternating Stress ($T_{rms}$) | $N/m^2$ | — | $29 \times 10^6$ | $29 \times 10^6$ |
| Stress-Limited Energy Density | $J/m^3$ | $T_{rms}^2/Y^H$ | — | $29 \times 10^3$ |
| Stress-Limited Energy Density | $J/m^3$ | $T_{rms}^2/Y^E$ | 11 300 | — |
| Field Bias | A/m | — | — | $0.1 \times 10^6$ |
| Field Bias | V/m | — | 0 | — |
| Alternating Field ($H_{rms}$) | A/m | — | — | $45 \times 10^3$ |
| Alternating Field ($E_{rms}$) | V/m | — | $390 \times 10^3$ | — |
| Field-Limited Energy Density | $J/m^3$ | $k^2 \mu^T H_{rms}^2$ | — | 4912 |
| Field-Limited Energy Density | $J/m^3$ | $k^2 \epsilon^T E_{rms}^2$ | 569 | — |
| Mass Density | $kg/m^3$ | — | 7 600 | 9210 |
| Electrical Resistivity | Ω-m | — | $>10^8$ | $580 \times 10^{-9}$ |
| Thermal Conductivity | W/m-K | — | ~2 | 13.5 |

Incidental to the fuel injector application, piezos have a built-in field bias. The table points out that the piezo material has no need for an external field bias, a decided advantage in a sinusoidal operation as the imposed electric field need not be biased. Moffett et al point out that bias can raise the sinusoidal output of piezos. To achieve the same result with GMM requires bulky and awkward permanent magnets. Alternately, field bias could be imposed through the solenoid coil, but this requires dissipating about as much or more power as would be applied sinusoidally. Heat removal becomes problematic and coupling suffers. Fortunately for fuel injection, field bias is undesirable as the goal is to move the control valve element as far as possible in only one direction.

Second, as noted in the table piezos require a field strength up to around 390 kV/m root mean square or about 550 kV/m peak. Moffett et al point out that this can be raised to 2 MV/m but does not comment on life expectancy.

To keep voltage within a reasonably low working range but still attain usable displacement, thin piezo slices P may be sandwiched between insulators to make a stack, as shown in FIG. 5. The mechanical softness of some insulators absorbs some of the piezo output Each piezo slice P must have two electrodes E and associated wiring. The axis of magnetomechanical response runs along the longitudinal axis A, as illustrated.

As an intermetallic alloy, GMM is a relatively good electrical conductor and is therefore subject to eddy current losses. Referring to FIG. 4, eddy current magnitude can be reduced by longitudinal laminating, but heat transfer resistance may increase across joints J, depending on what material is used to bond the GMM laminations G. Note that the planes of piezo laminations P (see FIG. 5) are perpendicular to the strain direction whereas the planes of GMM laminations G are usually substantially parallel to the axis of electromechanical response A. Therefore, the elastic compliance of any GMM laminations G absorbing strain output is not an issue but heat transfer through them could be.

Third, Pan et al. point out that in normal operational conditions piezos suffer from fatigue cracking, especially around their electrodes due to the high local field strength gradients. The electrical leads to stack slices are themselves subject to fatigue cycling. Under these same conditions, GMM is not known to fatigue due to its fundamentally different coupling mechanism. The fatigue life of GMM appears to be substantially higher than piezos as a class. This is particularly true under high specific energy transduction conditions, that is, when subjected to long periods of operation, especially at high frequency and high power. Further, the electrical leads go to the stationary solenoid coil and have no fatigue concern, which also means that an actuator using GMM can be considered to be magnetic.

Fourth, piezos tend to use precious metals for electrodes. GMM is made from terbium and dysprosium, available mainly from China at present, and iron.

Fifth, piezos are poor conductors of internally generated heat, increasing sensitivity to degradation induced by over-temperature. Thermal conductivities are compared in the table.

Sixth, GMM behaves approximately like mild steel. It can be immersed in a non-ionic liquid such as a hydrocarbon with no adverse effects. This means that the internal heat generated can be easily removed by the diesel oil itself.

Seventh, GMM requires a bulky solenoid coil to generate flux and a closed magnetic circuit for efficiency and uniformity since magnetic flux always loops back on itself. The additional materials tend to also be electrically conductive, adding to the eddy current loss without proper design.

Finally, SCMs share the property of frangibility. They have good compressive strength but poor tensile strength and are both susceptible to fracturing under shock or impact loads unless properly supported. U.S. Pat. No. 4,438,509 reports that both material classes will fracture at tensile stress as low as two thousand pounds-force per square inch. Since crack propagation generally requires tensile stress, putting the material under a compressive stress helps suppress crack growth.

Given the above information, the SCM offering the highest possible power density combined with tolerable disadvantages appears to be the GMM.

The ratio of incoming energy converted by the transducing material into outgoing energy of a different form defines its function as a transducer. A fast injector requires that high force be very quickly available to accelerate internal components. The arbitrarily high speed of this injector is limited only by how quickly and how high force appears with respect to the force requirements for internal component motion. Quickly getting high force requires a configuration that maximizes the conversion, or coupling, of the input electrical energy to magnetic energy and magnetic energy to mechanical energy per unit volume.

For a magnetostrictive transducer, the upper limit of coupling can be shown to be this lossless ratio: $k^2 = d_{33}^2 \times Y^H / \mu^T$ where $k^2$ is the dimensionless ratio, $d_{33}$ is the magnetostrictive strain, $Y^H$ is Young's modulus at constant field, and $\mu^T$ is permeability at constant stress. This is the upper limit because the equation is ideal, linear, reversible, and anhysteretic. Despite its limitations, this simple idealization is useful for design estimates.

Various material inventors and vendors tend to focus on a single component of this equation, most often $d_{33}$. For example, U.S. Pat. Nos. 6,273,966 and 6,300,855 show many S-H plots but are silent with respect to S-T and B-H plots, making it difficult to estimate $Y^H$ and $\mu^T$ and therefore $k^2$. The term giant magnetostrictive material or GMM was applied to the rare earth-transition metal magnetostrictive materials since $d_{33}$ is large with respect to earlier magnetostrictive materials such as nickel. Earlier magnetostrictive materials are exemplified by U.S. Pat. No. 6,299,703. U.S. Pat. No. 4,378,258 teaches that the particular material which has the greatest magnetostriction, such as the ferromagnetic shape memory alloys, may not be the most desirable for use in a particular article because other characteristics are unsuitable. Lack of knowledge of all three principal parameters makes design more difficult.

Care should be exercised when reviewing plots of stress, strain, and field. Typically, strain is represented as zero when field is zero, as exemplified by U.S. Pat. No. 6,300,855. This would be correct except that a compressive stress bias is usually introduced. Compression allows an actuator to gain bi-directional strain output, raises energy density, and acts to protect the material under adverse loading conditions.

Since no material is infinitely stiff, compression causes negative strain. During operation, the stress state must change within each cycle to produce net mechanical power output. Plots that show absolute strain as a function of both absolute stress and absolute field are uncommon. For different constant stresses, a better plot would show a family of strain versus field curves spread by stress, thus giving the elastic information needed for effective use. Some materials are shown with positive strain when in fact they shrink with field.

FIG. 1 plots GMM strain (S) with respect to magnetic field intensity (H) at different levels of constant compressive stress (T). Strain is independent of applied magnetic field polarity. The curve slopes decrease with increasing compressive stress, indicating that more field is required to achieve the same relative strain at higher compressive stress levels. This is to be expected since more work is being done, requiring more energy input. The loops are due to hysteresis. Magneto-mechanical coupling and consequent specific energy increase with increasing compressive stress, reducing size and cost while improving speed.

Coupling of electrical input power to mechanical output power is reduced by any energy that the transducer as a whole stores outside of its transducing material. Physics dictates that electric field lines do not close back on themselves but magnetic flux lines must. This puts GMM at a disadvantage with respect to piezos. A proper magnetic flux line return circuit significantly enhances GMM coupling but it still necessarily degrades maximum coupling. Similarly, the stiffness of any bias spring degrades coupling. To avoid shock impact re-loading, both SCMs must be compressed. A low stiffness spring minimizes external elastic energy storage.

BRIEF SUMMARY OF THE INVENTION

The features and advantages described in the specification are not all inclusive, and particularly, many additional features and advantages will be apparent to one of ordinary skill in the art in view of the drawings, specification, and claims hereof. Moreover, it should be noted that the language used in the specification has been principally selected for readability and instructional purposes, and may not have been selected to delineate or circumscribe the inventive subject matter, resort to the claims being necessary to determine such inventive subject matter.

It is an object of the present invention to provide an injector that enables almost arbitrary rate shaping of high pressure diesel oil to be achieved. That is, the injector can easily be made to quickly and proportionally control the volumetric flow rate at which fuel is delivered to the engine combustion chamber to aid in minimizing formation of diesel particulate matter and oxides of nitrogen.

It is an object of the present invention to bring the utility of giant magnetostrictive materials into more common use, particularly for use in liquid fuel injectors for internal combustion engines.

It is an object of the present invention to operate at low voltage such that corona discharge does not occur.

It is an object of the present invention to eliminate fatigue cracking of the transducing material.

It is an object of the present invention to eliminate the use of precious metals and strategic materials in the injector.

It is an object of the present invention to enable the application of control algorithms such that rate shaping characteristics can be customized for each engine cylinder, minimizing diesel particulate matter and oxides of nitrogen formation even further. Engine cylinders are not identical and therefore should not receive identical fuel volumetric flow rate shape patterns.

It is an object of the present invention to minimize the amount of transducing material to cut cost.

It is an object of the present invention to provide a lightweight, durable, very high speed rate shaping fuel injector.

It is an object of the present invention to avoid complexity.

BRIEF DESCRIPTION OF THE DRAWINGS

Numerous other objects, features, and advantages should now become apparent upon a reading of the following detailed description taken in conjunction with the accompanying drawings, in which.

DESCRIPTION OF THE EMBODIMENTS OF THE INVENTION

Those of ordinary skill in the art will realize that the following description of the present invention is illustrative only and not in any way limiting. Other embodiments of the inventions will readily suggest themselves to such skilled persons.

The embodiments disclosed herein were chosen and described in order best to explain the principles of the invention and its practical application, thereby to enable others skilled in the art best to utilize the invention in various embodiments and with various modification as are suited to the particular use contemplated therefor. It is intended that the scope of the invention be defined by the claims appended hereto, when interpreted in accordance with the full breadth to which they are legally and equitably entitled.

There are many possible hydro-mechanical embodiments of an injector that would take advantage of the almost arbitrary speed made possible by the properly embodied GMM element. The best embodiment will take advantage of both the high force and the limited strain offered by GMM. Previous embodiments are exemplified by U.S. Pat. Nos. 6,364,221 and 6,279,842, respectively the 221 injector and the 842 injector.

The 221 injector has an excessively bulky GMM element due to low compressive stress bias. Its speed is further slowed by the excessive number of turns of wire in the solenoid helix and the large masses it must accelerate to perform its function. Finally, it omits the magnetic flux return path. It therefore is necessarily a relatively slow device and is not discussed further. The 842 injector speed again suffers from the large number of turns of wire in the solenoid helix and from ineffective use of the limited displacement of the GMM element. The GMM element itself is not stressed highly enough nor is it short enough, both of which slow the device.

Figure 3:
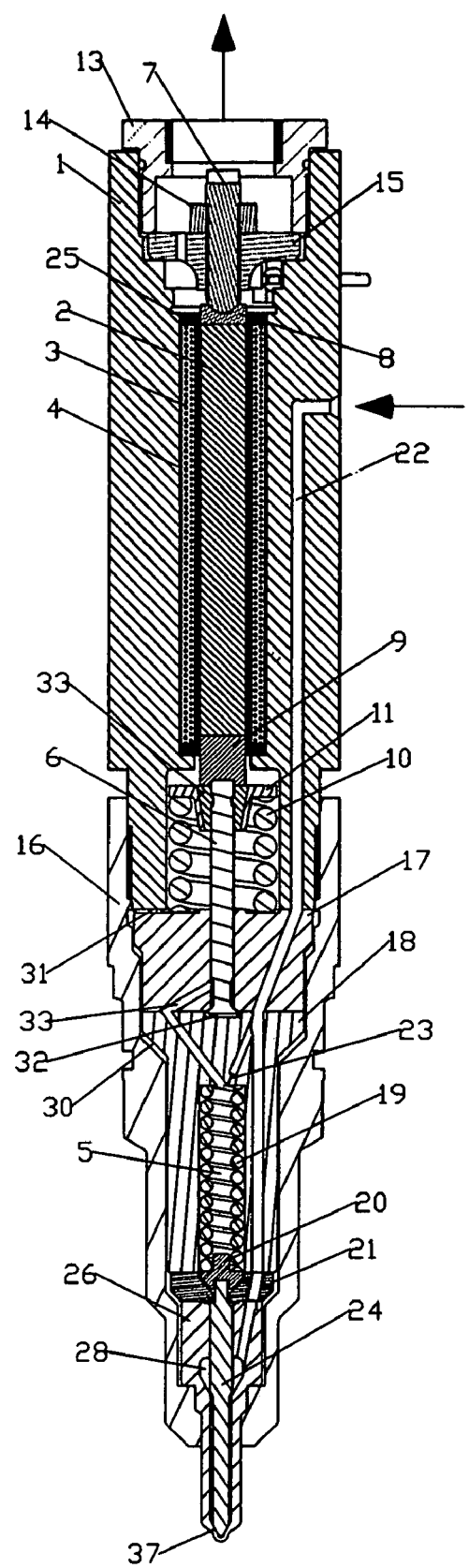
FIG. 3 is a section view of one embodiment of a high speed fuel injector of the present invention.

The embodiments of the present invention take advantage of the available high pressure diesel oil by controlling that pressure to use it as motive power. This lowers the amount of mass the GMM must accelerate, raising speed again, while simultaneously reducing size and cost. FIG. 3 illustrates one such embodiment.

With reference to FIG. 3, in one embodiment, the injector comprises a body 1 which houses a GMM transducer, adjustment mechanism and spring assembly. A housing 16 contains the control valve body 17, control valve 6, lower body 18, control chamber spring 19, cap 20, end cap 21, nozzle 26 and needle valve 24. While the body 1 and housing 16 are illustrated as two separate pieces, one of ordinary skill in the art will appreciate that the body 1 and housing 16 may be formed as a unitary piece.

The transducer illustrated in FIG. 3 employs a GMM element 2 with its grain oriented in the axial direction, bobbin 25 concentric to GMM element 2 (also refered to herein as magnetostrictive material), energizing helical windings 3 (also refered to herein as solenoid coil), ferromagnetic protective sheath 4 (also refered to herein as magnetic return path circuit) concentric to helical windings 3, and ferromagnetic end members 8 and 9. GMM element 2 is in operative disposition with control valve element 6 through ferromagnetic end cap 9.

As the GMM element 2 has its grain oriented in the axial direction, the GMM element 2 is provided as a solid magnetostrictive material with a favored direction of magnetostrictive response formed into a shape with ends that are substantially parallel to each other and substantially perpendicular to the favored direction of magnetostrictive response.

The shape of the solid magnetostrictive material 2 may be a cylinder, ellipsoid, parallelepiped, prismatic, other similar shapes, or other suitable shapes. The solid magnetostrictive material 2 may have a transverse dimension perpendicular to the direction of magnetostrictive response substantially smaller than one quarter wavelength at the electromechanical resonant frequency of the apparatus. The solid magnetostrictive material 2 may have a length in the direction of magnetostrictive response of no greater than one quarter wavelength at the electromechanical resonant frequency of the apparatus. As discussed in more detail below with regard to FIG. 4, the solid magnetostrictive material 2 may be divided by a plurality of joints into an element of discrete magnetostrictive slabs.

The solid magnetostrictive material 2 may be a formed of a rare earth-transition metal material. For example, the solid magnetostrictive material 2 may be formed of a grain-oriented polycrystalline rare earth-transition metal magnetostrictive material of the formula $Tb_xDy_{1-x}Fe_{2-w}$, wherein $0.20<=x<=1.00$ and $0<=w<=0.20$. The grains of the material have their common principal axes substantially pointed along the growth axis of the material which is within 10° of the $\lambda_{111}$ axis.

The solenoid coil 3 may be located concentric with the magnetostrictive material 2 and coaxial to the favored direction of magnetoelastic response. The solenoid coil 3 may be adapted to excite the magnetostrictive material 2 into mechanical motion.

The magnetic return path circuit 4 may be in magnetic communication with the solid magnetostrictive material 2. The magnetic return path circuit 4 may include ferromagnetic materials. For example, the magnetic return path circuit 4 material may be ferrite, the like, or other suitable material. The magnetic return path circuit 4 may substantially surround the solenoid coil 3.

Figure 6:
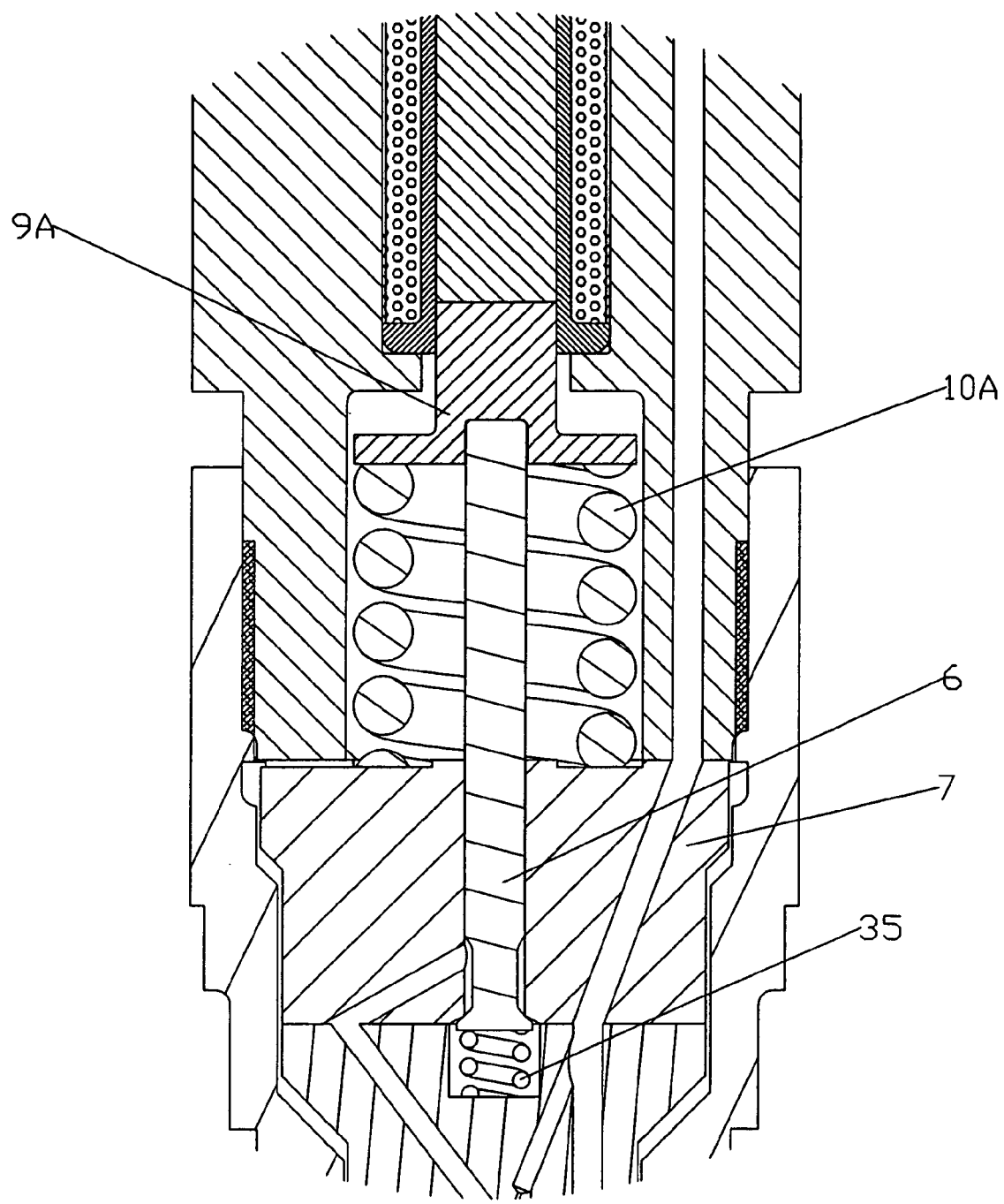
FIG. 6 illustrates the variation of spring elements that seat the control valve and apply compressive force to the GMM rod.
Figure 7:
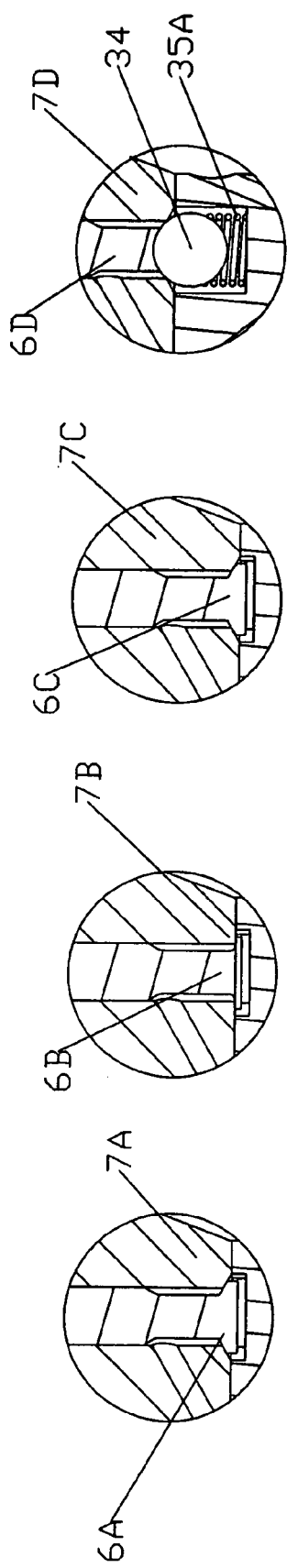
FIG. 7 illustrates various solutions of the control valve sealing seat.

With reference to FIGS. 6 and 7, the control valve element 6 may be located coaxial to the favored direction of magnetoelastic response of the magnetostrictive material 2. The control valve element 6 includes a sealing component selected such as a spherical ball 34 with spring 35A, a spherical ball 34 without spring, a conical shape 6A mated to a conical shape seat 7A, a curvilinear shape 6C mated to a conical shape seat 7C, conical shape 6A mated to a planar shape seat 7B, and planar shape 6B mated to a planar shape seat 7B, or the like. Where the sealing component of control valve element 6 is a spherical ball, the magnetostrictive material preload may be applied by a spring 35A separate from the spherical ball 34 sealing component. Where the sealing component of control valve element 6 is not a spherical ball, the magnetostrictive material preload may applied by a spring 35 seating the control valve element 6. Alternatively, where the sealing component of control valve element 6 is not a spherical ball, the magnetostrictive material preload may applied by a spring 10A separate from the spring that seats the control valve.

The control valve element 6 movement may be intensified by hydraulic pistons (not shown) of dissimilar area that cooperate through displaced fuel in a chamber. With reference to FIG. 3, the control valve element 6 may be controlled by the magnetostrictive material 2 in an analog fashion. Alternatively, the control valve element 6 may be controlled by the magnetostrictive material 2 in a binary fashion. The control valve element 6 movement being controlled in an analog fashion or in a in a binary fashion may control the opening and closing rate of an injector nozzle needle 24. The opening rate of the nozzle needle 24 controls a fuel injection rate shape. The opening and closing rates of the nozzle needle 24 may be controlled by operating an actuator in a "pulse width modulated" fashion.

In general, a mechanism adapted to subject the magnetostrictive material to a static compressive stress may be associated with the magnetostrictive material. The mechanism may subject the magnetostrictive material to a static compressive stress magnitude of no less than fourteen megapascals along the favored direction of magnetostrictive response with an effective stiffness no greater than one-fourth the stiffness of the magnetostrictive element without the magnetostrictive material being subjected to a magnetic field.

From the structure thus far described, it will be seen that GMM element 2 in conjunction with end members 8 and 9 and associated parts serve to maintain GMM element 2 in concentric relation as shown in FIG. 3. The desired amount of mechanical bias or precompression is obtained by the selective adjustment of screw 7 so as to draw end members 8 and 9 together and exert a compressive force on GMM element 2. Compressive force is applied by spring 10 through retainer 11. Spring 10 compresses when GMM element 2 elongates.

Bobbin 25 serves as a form for helical energizing winding 3. As is understood, such a helical winding produces a concentrated axial magnetic field which extends somewhat beyond the ends of the helical winding proper. Accordingly, it will be understood that the effective length of the helical energizing winding 3 in producing magnetostriction in GMM element 2 may extend beyond the winding itself and encompass one or both ends of GMM element 2 as required.

A protective sheath 4 is provided for protecting the outer portion of the helical energizing winding 3 and providing a magnetic flux return path.

The compressive bias adjustment mechanism illustrated in FIG. 3 comprises a screw 7, nut 14, washer 15 and cap 13. Cap 13 retains washer 15 in body 1. Screw 7 is threaded into washer 15 and nut 14 locks screw 7 in place.

Feeding line 22, which feeds the fuel at high pressure, connects a common rail (not shown) to the injection valve pressure chamber 28. The control chamber 5 is in constant fluid communication with feeding line 22 by means of a flow restrictor 23. Chamber 5 is in fluid communication with duct 33 and the diametrical clearance between block 17 and valve 6. This clearance is closed at the interface of the sealing surface of valve 6 and block 17. Chamber 32 is in fluid communication with diametrical clearance 30 by means of a radial groove at the top of block 18. Diametrical clearance 30 is in fluid communication with radial groove 31. Groove 31 is in fluid communication with clearances between GMM element 2 and bobbin 25.

Spring 19 contacts cap 20 and cap 20 contacts needle 24. Needle 24 seats on nozzle 26, closing the passage to the engine combustion chamber.

U.S. Pat. No. 2,930,912 provides a method for mechanically coupling the frangible SCM together with the rest of the transducer components by compressing the SCM in the direction of electromechanical action. The minimum amount of compression is chosen to ensure that the SCM does not experience tensile stress or shock impact re-loading during operation, avoiding fracture and destruction. This compression method requires that mechanical elements be placed in tension or shear. In prior art as exemplified by U.S. Pat. Nos. 2,930,912; 4,438,509; and 5,510,660 it was assumed that this mechanical element be substantially less stiff than the transducing material to avoid appreciably decreasing the overall transducer coupling factor.

The minimum compressive bias to be used constitutes a stress sufficient to continuously maintain the GMM element 2 in operative disposition with the control valve element 6 under all dynamic conditions, e.g. contacting each other so that mechanical power may be transferred from the GMM element 2 to the control valve element 6.

The desired amount of mechanical bias or precompression is obtained by the selective adjustment of screw 7 so as to draw end members 8 and 9 together and exert a compressive force on GMM element 2. During fuel injector assembly, free of any magnetic field, GMM element 2 is compressed to an initial bias stress state, $^-T_b$, where the mathematical negative sign (−) is in accordance with the convention for compressive stress, force, and strain. $^-T_b$ results in a compressive strain $^-S_b$. The corresponding secant Young's modulus between the free, unmagnetized state and the compressed, unmagnetized state is then:

$$Y_b = (^-T_b - 0)/(^-S_b - 0)$$

which is a positive quantity. Since field H is zero throughout this compression, $Y_b$ may be taken to be $Y_b^H$.

Figure 1:
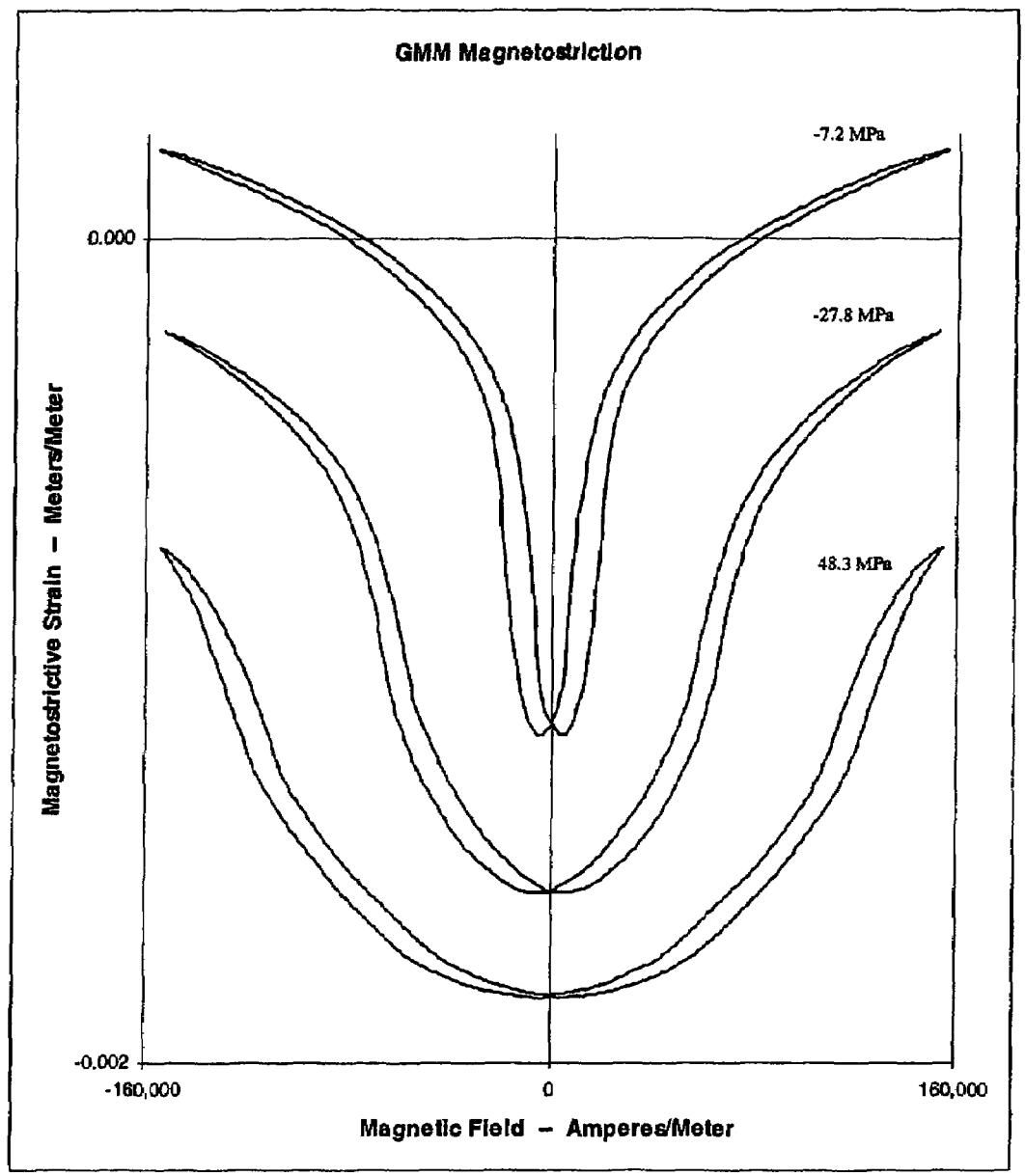
FIG. 1 graphs absolute magnetostrictive strain as a function of magnetic field strength for three different constant compressive stresses.

To transmit mechanical work across its boundary, GMM element 2 must be packaged and excited such that it can exert a net force over a distance. Since it is a cyclic device, there must be a net difference within each cycle in the amount of mechanical work performed. For example, the force exerted by GMM element 2 when it accelerates control valve element 6 must be different from the force exerted when it decelerates that element. Force is the product of stress T times GMM element 2 cross-sectional area normal to its strain S direction and distance is the product of strain S times GMM element 2 length. Since net work from a cyclic device requires both stress and strain of the transducing material to change within each cycle, the usefulness of plotting the data as shown in FIG. 1 is demonstrated.

When fully assembled with compressive bias and upon application of a magnetic field of either polarity, ±H, by means of energizing helical winding 3, GMM element 2 transduces part of the resulting magnetic flux density ±B into a mechanical elastic response as follows. Initially, compressive stress magnitude must increase since strain cannot occur without increased stress. This stress acts outwardly, changing the force balance of all dynamic components. Static force balance is restored with an elongated GMM element 2 due to positive strain. When GMM element 2 lengthens, it displaces control valve element 6 by exactly the same amount.

Since GMM element 2 is ultimately held in compression by housing 1 and end cap 9, this length increase is balanced by a length decrease in spring 10, assuming a rigid housing 1 and no force changes caused by dynamic effects or pressure changes on control valve element 6. The length decrease in compressed spring 10 can only occur by increased force, requiring that a corresponding increase in compressive stress has occurred in GMM element 2 to maintain the force balance. That is, in absolute terms, compressive stress $^-T_1$ in GMM element 2 is more negative than stress state $^-T_b$ but strain state $^-S_1$ is less negative than strain state $^-S_b$. The corresponding secant Young's modulus between the free, unmagnetized state and the compressed, magnetized state is then:

$$^-Y_1=(^-T_1+T_b)/(^-S_1+S_b)$$

which must be stiffer since strain is reduced under higher stress. Thus, the new force balance is achieved. $^-Y_1$ must be and is a negative quantity, indicating that it is the source of mechanical work that the transducer transmits across its boundary. Since H is not constant and non-zero, $^-Y_1$ may not be taken to be $^-Y_1{}^H$ in the strictest sense, yet it is still useful to estimate performance.

Figure 2:
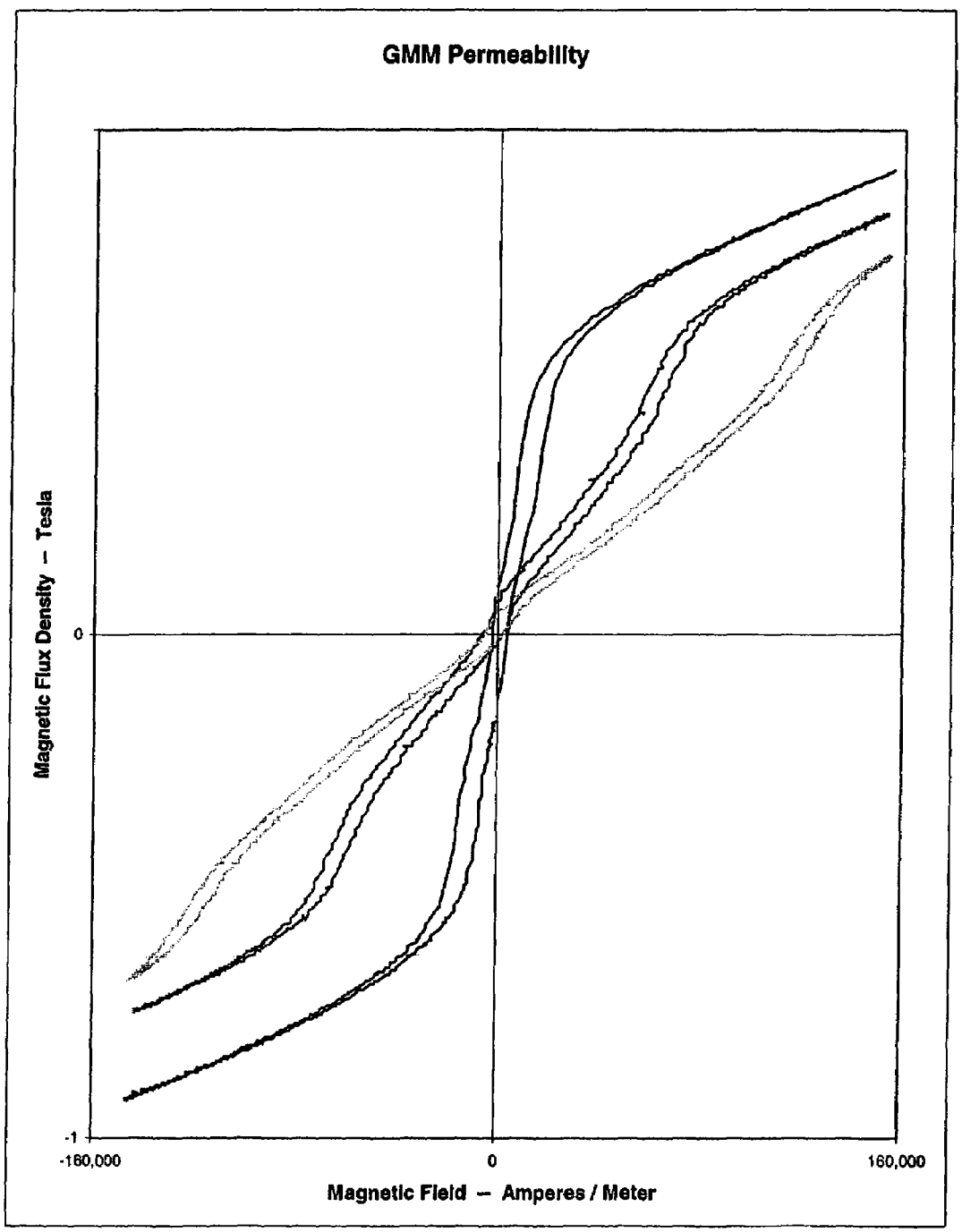
FIG. 2 graphs magnetic flux density as a function of magnetic field strength for three different constant compressive stresses.

Once stress, strain, and field have been estimated, Young's modulus $Y^H$ and magnetostrictive strain coefficient $d_{33}$ can be estimated from FIG. 1. Stress and field are used with FIG. 2 to estimate a secant permeability $\mu^T$ for performance prediction. Once again, high compressive stress lowers the amount of GMM required and its permeability. Speed is raised by reducing that portion of its mass that must be accelerated and by lowering inductance.

For fast response, helical energizing winding 3 is comprised of insulated electrically conductive wire wound in a tight helix using as few turns of wire as possible wound into as few layers as possible. This lowers transducer inductance and therefore lowers the voltage requirement for fast response. To get the necessary magnetic field then requires high current through this fast coil. Wire diameter and number of layers are determined by source capability and eddy current loss considerations as well as the primary consideration of speed.

Figure 4:
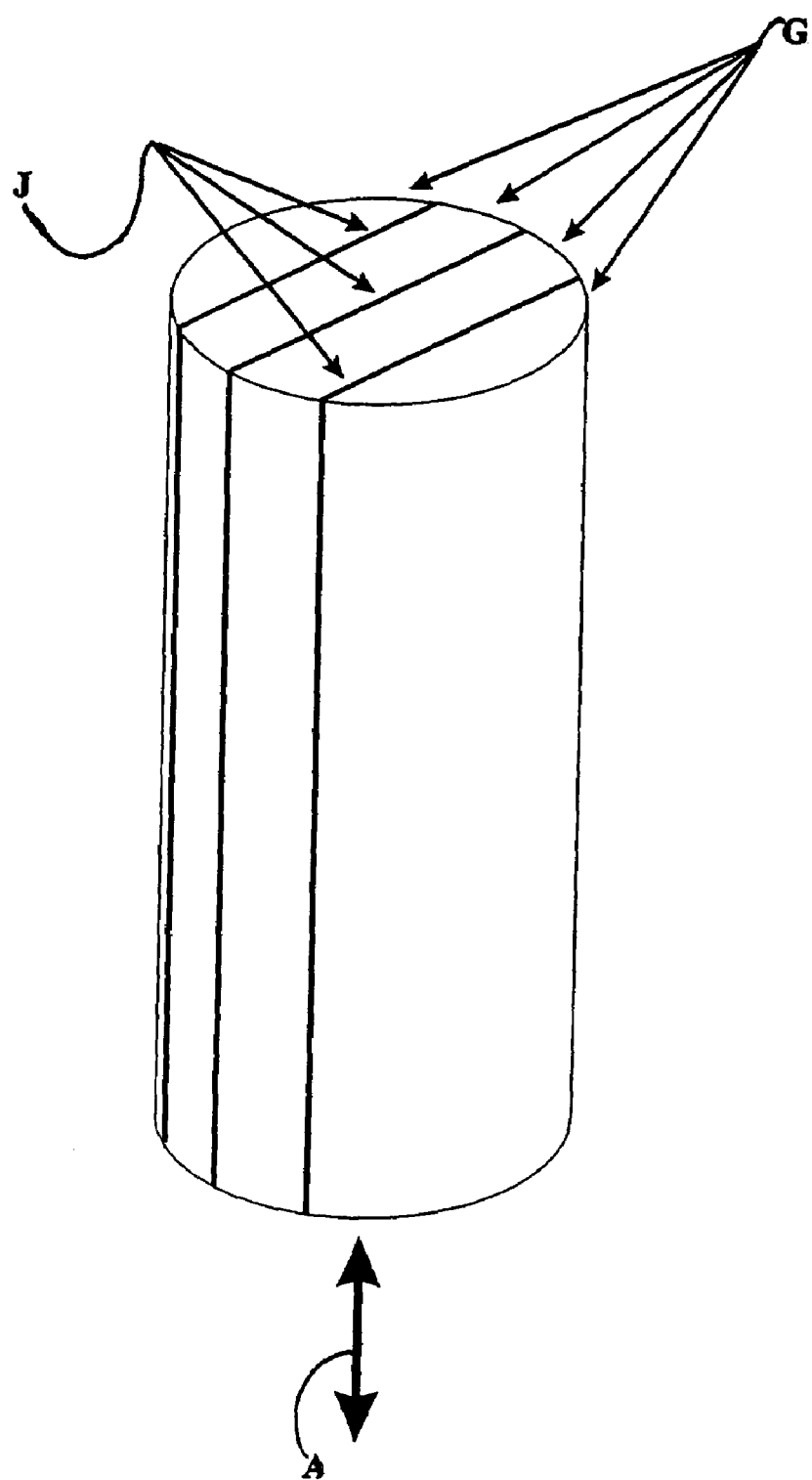
FIG. 4 is an isometric view of the GMM element, illustrating the orientation of the eddy current control laminations with respect to the magnetomechanical axis.
Figure 5:
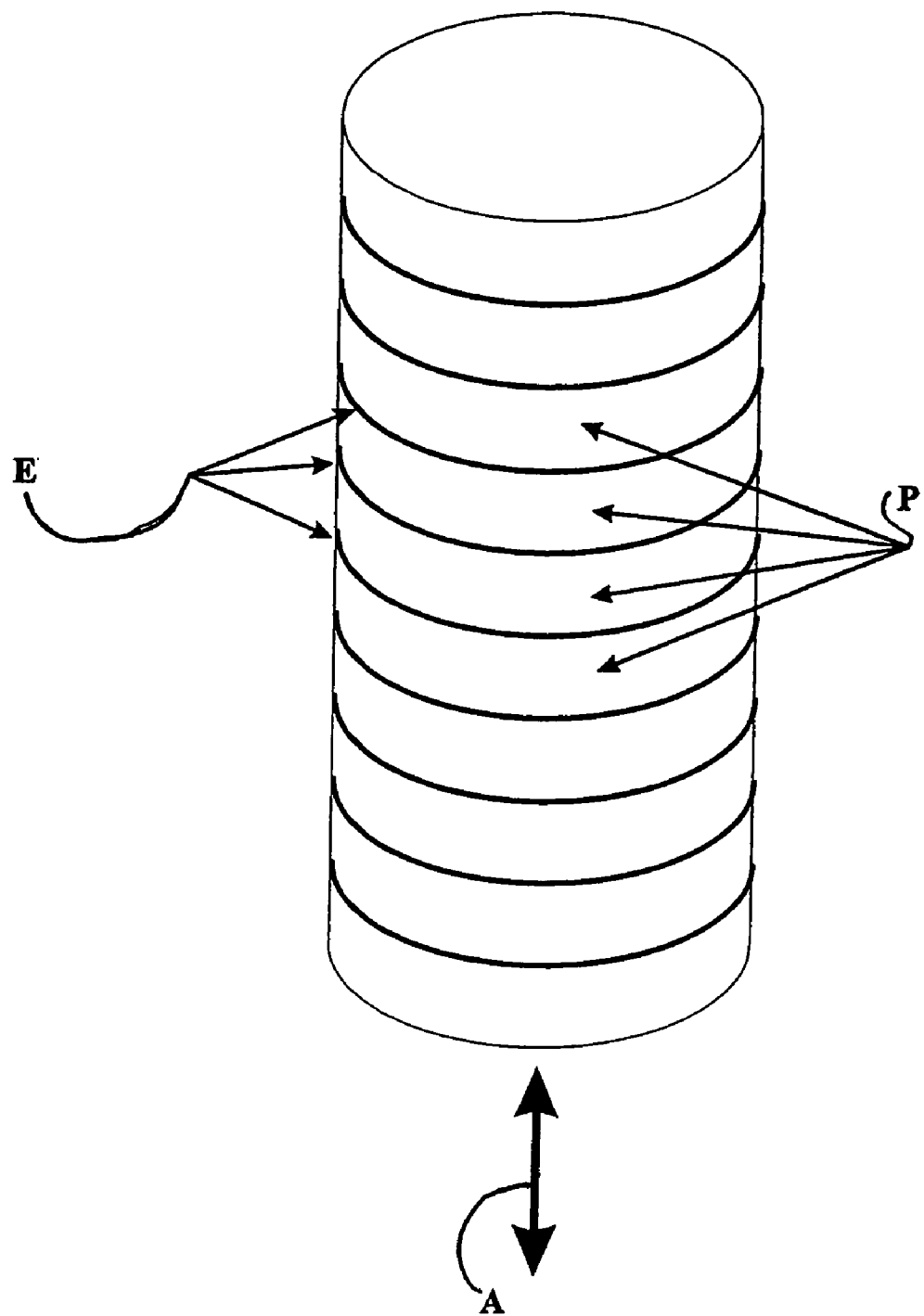
FIG. 5 is an isometric view of the piezoelectric ceramic stack element, illustrating the voltage control laminations and moving electrode locations with respect to the electromechanical axis.

A magnetic line of flux moving through an electrically conductive material induces an electric field to curl around it, giving rise to power-dissipating eddy currents. Not only do they waste power, but eddy currents result in a flux gradient, decreasing from the surface. In other words, the eddy currents oppose and delay full flux penetration. Referring to FIG. 4, eddy current losses in GMM are minimized and flux penetration is maximized by assembling thin rectangular parallelepipeds with planar surfaces bonded with an electrically-insulating bonding agent such as epoxy, the planar surfaces being substantially aligned with the magnetomechanical cause and effect axis. Each laminate G is ideally no thicker than twice the eddy current skin depth, one of the fundamental limits on the arbitrary speed capability of this transducer. Each laminate G is joined by an electrically non-conductive adhesive joint J. The axis of magnetomechanical response runs along the longitudinal axis A, as illustrated.

Finally, U.S. Pat. No. 4,914,412 teaches the improvement available from a magnetic circuit. Magnetic flux lines have no beginning and no end—they always close back on themselves. Further, for a given field intensity, more flux lines can be generated if a suitable return path of high permeability is provided.

Ideally, flux is confined to GMM element 2. Because of its frangibility, the practical shape is as a straight rod with the magneto-mechanical cause and effect axis aligned in the longitudinal direction. That is, magnetic cause and mechanical effect occur coaxially as do mechanical cause and magnetic effect if operated reciprocally. Since the individual magnetic lines of force that comprise the magnetic flux always close back on themselves, they penetrate either free space or preferably a soft ferromagnetic material, the soft ferromagnetic material preferably having high permeability, low electrical conductivity, and low hysteresis. For a given magnetomotive force such as that available from helical energizing winding 3, the flux density that can be achieved within GMM element 2 depends on the permeability of the entire path, not just of the GMM. Therefore, it may be desired to provide a magnetic return path outside of the GMM of high permeability and low hysteresis because that path lessens the magnetomotive force required to develop a given flux density. This is clearly also the reason why the high permeability return path with low hysteresis improves the electromechanical coupling factor. Another way to improve the coupling factor is to eliminate as much space as possible between helical energizing winding 3 and concentric GMM element 2.

The electrically conductive helical energizing winding 3 preferably extends beyond the proximal and distal ends of GMM element 2 to assure uniformity of the applied magnetic field.

Commercially available sintered ferromagnetic powder materials are available that are inexpensive and can be shaped into an appropriate low-loss magnetic return path. Sintered materials are preferred to avoid unnecessary eddy current losses in the return path.

When the GMM actuator is electrically de-energized, control valve 6 comes in contact with the valve seat in 17, interrupting the connection between control chamber 5 and chamber 32. Since control chamber 5 is constantly connected to, by means of the flow restrictor 23, to feeding line 22 that carries high pressure fuel from the common rail to the injection valve, it follows that control chamber 5 assumes the same level of pressure contained in feeding line 22.

The pressure in control chamber 5 along with the load of spring 19 keeps needle 24 compressed against its seat 27. Therefore, in the situation described above no fuel injection takes place.

When the GMM actuator is electrically energized, the elongation of rod 2 is transferred through the contact between member 9 and contact between valve 6. Valve 6 lifts from the sealing surface allowing control chamber 5 to be connected to radial groove 32 via duct 33. Control chamber 5 hydraulic pressure is then connected to the lower pressure drain to tank 36. Owing to the fact that drain line 36 is now connected to the control chamber 5 and a flow restrictor 23 is provided in the connection duct between control chamber 5 and feeding line 22, the pressure in control chamber 5 will undergo a considerable reduction.

The subsequent reduction in hydraulic force acting on needle 24's upper surface enables the high pressure operating on needle 24's lower surface at chamber 28 to exceed the push that keeps needle 24 closed. The quantity of fuel injected into the cylinder of the associated internal combustion engine will depend not only on the fuel pressure, but also on the duration and modulation of the electrical signal provided to the GMM actuator.

When the electrical signal ends, the GMM actuator will return to its original length, causing control valve 6 to seal and pressure to rise in control chamber 5 as fuel is supplied through flow restrictor 23. Following this, the pressure in control chamber 5 will return to the same level as that of the fuel contained in feeding line 22. The increase of pressure in control chamber 5 will cause needle 24 to close against seat 27, ending fuel injection into the engine cylinder.

Modulating the electric signal to the GMM actuator allows the precise control of the opening and closing of valve 6 and the subsequent decay and rise of pressure in control chamber 5. The precise control of pressure in control chamber 5 allows control of the lift rate of needle 24 and the subsequent fuel delivery rate to the cylinder. Once the fuel injection system is pressurized, a fuel injection event begins by applying the pre-determined electrical waveform to the solenoid helix. The GMM element elongates as set forth above and opens the control valve element. This vents pressure from the pressure relief chamber and the valve control chamber. The vented fuel returns to the fuel tank. As the pressure in the valve control chamber drops, the hydraulic force on the needle valve becomes unbalanced. The pressure in the needle valve control chamber becomes greater, causing the needle valve to lift. Once the needle valve lifts, fuel delivery to the combustion chamber begins. The proportional control available from the GMM allows the rate of pressure decay in the valve control chamber to be defined, which in turn defines needle valve motion. Fuel is delivered to the combustion chamber as long as the control valve is open and the pressure in the valve control chamber is lower than the pressure in the needle valve control chamber.

Fuel injection ends by ending the flow of current in the solenoid helix. The collapsing magnetic field causes the GMM to contract, closing the control valve. The rate at which the field collapses and thus the rate at which the GMM contracts can be electrically controlled. In particular, using reversed voltage of appropriate magnitude can help quicken current flow reduction, in turn quickening field collapse and GMM element contraction. Once the control valve closes, the pressure in the valve control chamber returns to rail pressure causing the needle valve to close, ending fuel delivery to the combustion chamber.

The operation of the fuel injector is believed to be self-evident from the foregoing description and theoretical analysis. Stated briefly, the electrical waveform applied to leads is conducted to solenoid coil leads, which converts it to a magnetic waveform. A right circular cylinder of laminated GMM is disposed concentrically within the energizing solenoid coil and compressed by the housing and bias spring in concert. The compressed GMM transduces the magnetic waveform to a mechanical waveform. During expansion, the GMM expands from its unenergized condition to drive the control valve element. During contraction, the GMM contracts allowing the compressed spring or springs to return the control valve element and thus preserve the integrity of the GMM element.

What is claimed is:

1. Apparatus for injecting fuel into a combustion chamber of an internal combustion engine comprising:
    a solid magnetostrictive material with a favored direction of magnetostrictive response formed into a shape with ends that are substantially parallel to each other and substantially perpendicular to the favored direction of magnetostrictive response;
    a control valve element located coaxial to the favored direction of magnetoelastic response of the magnetostrictive material;
    a solenoid coil located concentric with the magnetostrictive material and coaxial to the favored direction of magnetoelastic response, the solenoid coil adapted to excite the magnetostrictive material into mechanical motion;
    a magnetic return path circuit in magnetic communication with the solid magnetostrictive material; and
    a mechanism associated with the magnetostrictive material, the mechanism adapted to subject the magnetostrictive material to a static compressive stress magnitude of no less than fourteen megapascals along the favored direction of magnetostrictive response with an effective stiffness no greater than one-fourth the stiffness of the magnetostrictive element without the magnetostrictive material being subjected to a magnetic field by the mechanism.

2. The apparatus as claimed in claim 1 in which the solid magnetostrictive material comprises a grain-oriented polycrystalline rare earth-transition metal magnetostrictive material of the formula $Tb_xDy_{1-x}Fe_{2-w}$ wherein $0.20<=x<=1.00$ and $0<=w<=0.20$ wherein the grains of the material have their common principal axes substantially pointed along the growth axis of the material which is within 10° of the $\lambda_{111}$ axis.

3. The apparatus as claimed in claim 2 in which the solid magnetostrictive material is a rare earth-transition metal magnetostrictive material divided by a plurality of joints into an element of discrete magnetostrictive slabs.

4. The apparatus as claimed in claim 1 in which the solid magnetostrictive material is a rare earth-transition metal magnetostrictive material having a transverse dimension substantially smaller than one quarter wavelength at the electromechanical resonant frequency of the apparatus.

5. The apparatus as claimed in claim 4 in which the solid magnetostrictive material is a rare earth-transition metal magnetostrictive material having a length in the direction of magnetostrictive response of no greater than one quarter wavelength at the electromechanical resonant frequency of the apparatus.

6. The apparatus as claimed in claim 1 in which the control valve element is controlled by the magnetostrictive material in an analog fashion.

7. The apparatus as claimed in claim 1 in which the control valve element is controlled by the magnetostrictive material in a binary fashion.

8. The apparatus as claimed in claim 6 in which the control valve element analog movement controls the opening and closing rate of an injector nozzle needle.

9. The apparatus as claimed in claim 8 in which the nozzle needle opening rate controls a fuel injection rate shape.

10. The apparatus as claimed in claim 7 in which a nozzle needle opening and closing rate is controlled by operating an actuator in a "pulse width modulated" fashion.

11. The apparatus as claimed in claim 1 in which the magnetic return path circuit substantially surrounds the solenoid coil.

12. The apparatus as claimed in claim 11 in which the magnetic return path circuit material is ferrite.

13. The apparatus as claimed in claim 1 in which the control valve element includes a sealing component selected from the group consisting of a spherical ball with spring, a spherical ball without spring, a conical shape mated to a conical shape seat, a curvilinear shape mated to a conical shape seat, conical shape mated to a planar shape seat, and planar shape mated to a planar shape seat.

14. The apparatus as claimed in claim 1 in which the control valve element includes a sealing component of a spherical ball in which the magnetostrictive material preload is applied by a spring separate from the spherical ball sealing component.

15. The apparatus as claimed in claim 1 in which the control valve element includes a sealing component selected from the group consisting of a conical shape mated to a conical shape seat, a curvilinear shape mated to a conical shape seat, conical shape mated to a planar shape seat, and planar shape mated to a planar shape seat, in which the magnetostrictive material preload is applied by a spring seating the control valve.

16. The apparatus as claimed in claim 1 in which the control valve element includes a sealing component selected from the group consisting of a conical shape mated to a conical shape seat, a curvilinear shape mated to a conical shape seat, conical shape mated to a planar shape seat, and planar shape mated to a planar shape seat, in which the magnetostrictive material preload is applied by spring separate from the spring that seats the control valve.

17. The apparatus as claimed in claim 1 in which the control valve movement is intensified by hydraulic pistons of dissimilar area that cooperate through displaced fuel in a chamber.

18. The apparatus of claim 1, wherein the shape of the solid magnetostrictive material is selected from the group consisting of a cylinder, ellipsoid, parallelepiped, and prismatic.

* * * * *

UNITED STATES PATENT AND TRADEMARK OFFICE
CERTIFICATE OF CORRECTION

| | | |
|---|---|---|
| PATENT NO. | : 7,255,290 B2 | Page 1 of 1 |
| APPLICATION NO. | : 11/136349 | |
| DATED | : August 14, 2007 | |
| INVENTOR(S) | : Charles B. Bright and Jon C. Garza | |

It is certified that error appears in the above-identified patent and that said Letters Patent is hereby corrected as shown below:

On the Title page, item [73] column 1, Assignee: delete the words "Charles B. Bright, Ames, IA (US)"

Signed and Sealed this

Twelfth Day of February, 2008

JON W. DUDAS
*Director of the United States Patent and Trademark Office*